US006654308B1

(12) United States Patent
Carter

(10) Patent No.: US 6,654,308 B1
(45) Date of Patent: Nov. 25, 2003

(54) MEMORY HAVING MULTIPLE WRITE PORTS AND MULTIPLE CONTROL MEMORY UNITS, AND METHOD OF OPERATION

(75) Inventor: Richard J. Carter, Los Altos, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/326,779

(22) Filed: Dec. 23, 2002

(51) Int. Cl.$^7$ ................................................. G11C 8/00
(52) U.S. Cl. ............................ 365/230.05; 365/189.01
(58) Field of Search ...................... 365/230.05, 189.01, 365/189.02, 189.04, 230.01, 230.02, 189.05

(56) References Cited

U.S. PATENT DOCUMENTS

| | | | |
|---|---|---|---|
| 5,325,504 A | | 6/1994 | Tipley et al. |
| 5,563,829 A | | 10/1996 | Huang |
| 5,629,901 A | * | 5/1997 | Ho ........................ 365/230.05 |
| 5,802,003 A | * | 9/1998 | Iadanza et al. ........ 365/230.03 |
| 5,923,608 A | | 7/1999 | Payne |
| 5,940,603 A | | 8/1999 | Huang |
| 6,005,794 A | | 12/1999 | Sheffield et al. |
| 6,078,995 A | | 6/2000 | Bewick et al. |
| 6,104,663 A | | 8/2000 | Rablanian |
| 6,151,258 A | * | 11/2000 | Sample et al. ......... 365/189.05 |
| 6,212,122 B1 | | 4/2001 | Wen |
| 6,216,205 B1 | | 4/2001 | Chin et al. |
| 6,233,659 B1 | | 5/2001 | Cohen et al. |
| 6,243,294 B1 | | 6/2001 | Rao et al. |
| 6,271,866 B1 | | 8/2001 | Hancock et al. |
| 6,282,143 B1 | * | 8/2001 | Zhang et al. .......... 365/230.05 |

OTHER PUBLICATIONS

H. Liu et al., Cache, Matrix Multiplication and Vector, Introduction of Cache Memory, Summer 2001, 14 pages.
Smith, A Comparative Study Of Set Associative Memory Mapping Algorithms and Their use For Cache And Main Memory, IEEE: Transactions Of Software Engineering., vol. SE–4., No. 2, Mar. 1978, pp. 121–122 and 129–130.
Maruyama, mLRU Page Replacement Algorithm In Ters Of The Reference Matrix, IBM Technical Disclosure Bulletin, vol. 17, No. 10, Mar. 1975, pp. 3101–3103.
Maruyama, Implementation of the Stack Operation Circuit For LRU Algorithm, IBM Technical Disclosure Bulletin, vol. 19, No. 1, Jun. 1976, pp. 321–325.
Smith, Cache Memories., University of CA., Berkeley, CA, Computing Surveys, vol. 14, No. 3, Sep., 1982, pp. 473–530.

* cited by examiner

Primary Examiner—Anh Phung

(57) ABSTRACT

A control unit is described that allows multiple data memory units to be combined to construct a memory having a greater number of write ports than is selectable from a design library. A control unit is provided using control memory units to keep track of which of the data memory units contain the most recently written version of the data for each address of the constructed memory. The data memory units and control memory units do not require more write ports than the maximum number available for memory devices selectable from the design library.

20 Claims, 8 Drawing Sheets

MEMORY HAVING MULTIPLE WRITE PORTS AND MULTIPLE CONTROL MEMORY UNITS, AND METHOD OF OPERATION

RELATED APPLICATIONS

The patent applications MEMORY HAVING MULTIPLE WRITE PORTS AND METHOD OF OPERATION, Carter, Ser. No. 10/326,091 filed on Dec. 23, 2002, and MEMORY HAVING MULTIPLE WRITE PORTS AND WRITE INSERT UNIT, AND METHOD OF OPERATION, Carter, Ser. No. 10/326,405 filed on Dec. 23, 2002, are filed concurrently with the present application and incorporated herein by reference.

BACKGROUND

1. Field of the Invention

The present invention relates generally to memory devices, and more particularly, to providing a more capable memory from less capable memory components.

2. Background Information

It is known to combine multiple memory components, such as static random access memory devices, to produce a larger memory array having enhanced capability. For example, smaller memory components can be combined in an array to form a wider memory (i.e., a memory wherein the addressable locations include a larger number of bits). Each of the smaller memory components that form the array have common address and control signals, but have separate data in and data out signals. Alternately, smaller memory components can be combined into an array to form a larger memory of increased depth (i.e., a memory with a larger number of addressable locations). Such arrays involve the use of decoders and read data multiplexers. In combining smaller memory components to form a memory array, focus has been on the desired width or depth of the memory array, and the address signals used.

Some design systems allow designers to create a circuit of connected components selected from a design library. The maximum number of write ports on any memory device to be included in the circuit is limited by the memory components available in the design library. For the case of Field Programmable Gate Arrays (FPGAs), the design library includes the primitive hardware structures of the FPGA (e.g. configurable logic blocks or block RAMs) and any higher-level design elements provided by a "core generator" or other such FPGA design tools. Similarly, for Application Specific Integrated Circuits (ASICs), the design library includes of a fixed number of standard-cell or other pre-verified component designs. For these and other technologies, any design that involves a memory with more than the maximum number of write ports supported by the design library is unrealizable in that technology.

SUMMARY OF THE INVENTION

Exemplary embodiments of the present invention are directed to providing a memory having N write ports, where N is greater than two. The memory includes a first data memory unit having a plurality of storage locations addressable by a range of addresses, and having less than N write ports. The memory also has a second data memory unit having a plurality of storage locations addressable by the range of addresses. The second data memory unit has less than N write ports. The memory further includes a control unit configured to select among the first and second data memory units in response to a read command having an associated read address which falls within the address range. The control unit includes multiple control memory units, each having less than N write ports. One of the control memory units has a first and second write port and is configured such that a first value is written through the first write port when a predetermined write port associated with the first data memory unit is used to write, and such that a second value is written through the second write port when another predetermined write port associated with the second data memory unit is used to write. The first and second values are determined independently of data read from a control memory unit.

Exemplary embodiments of the present invention are also directed to a method for operating a memory including the steps of providing a memory having N write ports, where N is greater than 2, the memory is constructed from multiple data memory units each having less than N write ports and having a range of addressable storage locations. The method comprises supplying information to an addressable location of the memory which falls within the range of addressable locations, and updating a control memory unit by writing a first value through a first write port of the control memory unit when a predetermined write port associated with a first data memory unit is used to write, and by writing a second value through a second write port of the control memory unit when another predetermined write port associated with the second data memory unit is used to write. The first and second values are determined independently of data read from a control memory unit.

The present invention is also directed to a control unit for memory having N write ports, where N is greater than 2. The control unit includes multiple control memory units, each having less than N write ports. One of the control memory units has first and second write ports and is configured such that a first value is written through the first write port when a predetermined write port associated with the first data memory unit is used to write, and such that a second value is written through the second write port when another predetermined write port associated with the second data memory unit is used to write. The control unit also includes at least one select unit receiving read data from the control memory units at a read address provided to the memory, the at least one select unit producing an indication of a data memory unit. The first and second values are determined independently of data read from a control memory unit.

The present invention is further directed to a system including a memory. The memory has N write ports, wherein N is greater than 2. The memory comprises a first data memory unit with a plurality of storage locations addressable by a range of addresses. The first data memory unit has less than N write ports. The memory has a second data memory unit having a plurality of storage locations addressable by the range of addresses. The second data memory unit has less than N write ports. The control unit is configured to select among the first data memory unit and the second data memory unit in response to a read command having an associated read address which falls within the address range. The control unit includes multiple control memory units, each having less than N write ports. One of the multiple control memory units has first and second write ports and is configured such that a first value is written through the first write port when a predetermined write port associated with the first data memory unit is used to write, and such that a second value is written through the second write port when another predetermined write port associated with the second data memory unit is used to write. The first and second values are determined independently of data read from a control memory unit. The system includes logic configured to access the memory.

BRIEF DESCRIPTION OF THE DRAWINGS

Other objects and advantages of the present invention will become apparent to those skilled in the art upon reading the following detailed description of preferred embodiments, in conjunction with the accompanying drawings wherein.

DETAILED DESCRIPTION OF EXEMPLARY EMBODIMENTS

Figure 1:
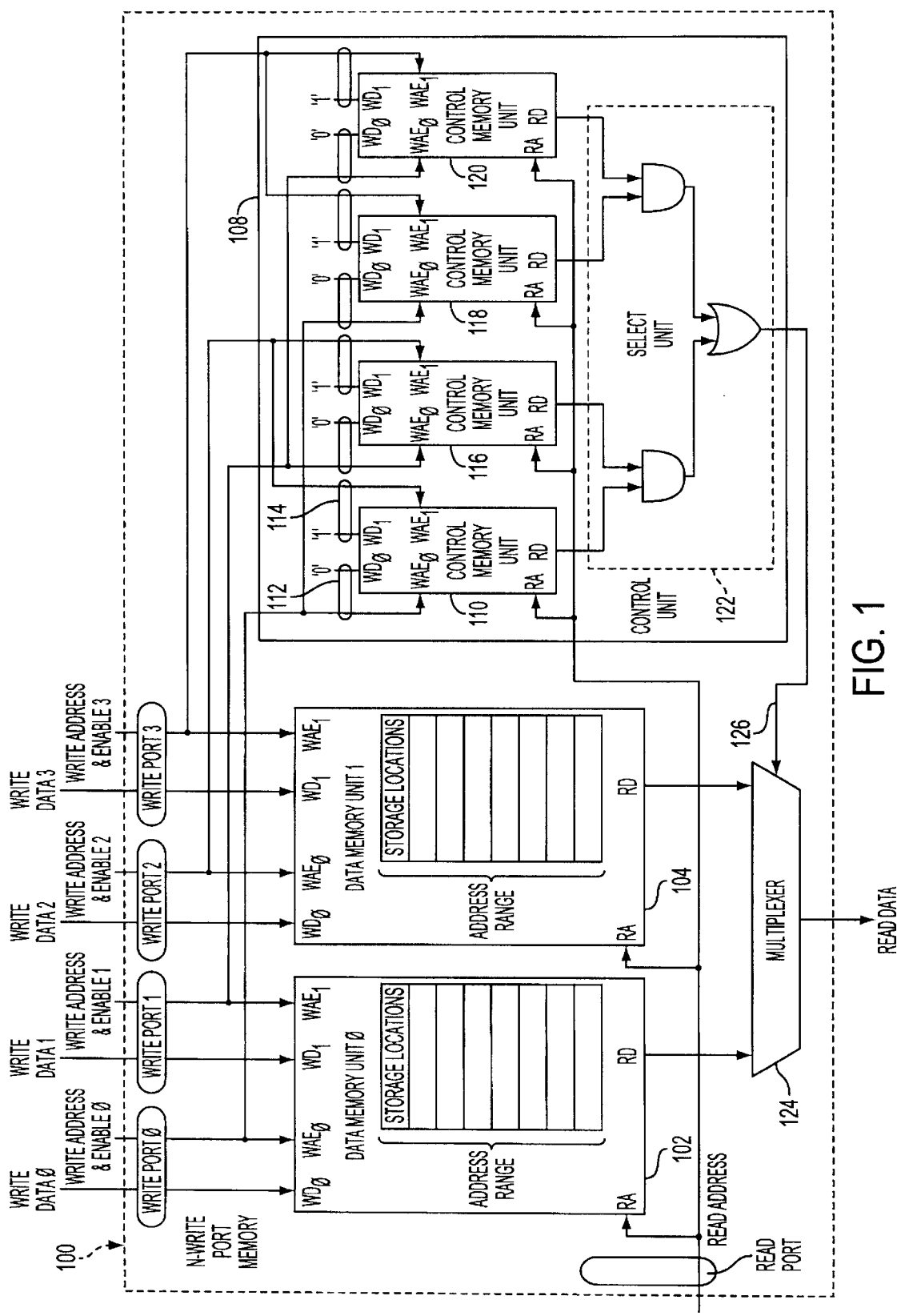
FIG. 1 is a diagram of an exemplary embodiment of the present invention that illustrates a memory constructed of multiple data memory units and a control unit.

In an exemplary embodiment of the present invention, a memory, such as memory 100 of FIG. 1, has N write ports, where N is greater than 2. The memory comprises a first data memory unit, such as data memory unit 102 of FIG. 1, having a plurality of storage locations addressable by a range of addresses. The first data memory unit has less than N write ports. The memory includes a second data memory unit, such as data memory unit 104 of FIG. 1, having a plurality of storage locations addressable by the range of addresses. The second data memory unit has less than N write ports.

The data memory units are implemented with any type of memory device, alone or in combination. Examples of memory devices include static memory, dynamic memory, memories operating at a multiple of the system clock frequency, and the like. The memory devices used to create the data memory units can be designed using a design library such as an FPGA or ASIC design library. The memory 100 can have a greater number of write ports than the maximum number of write ports available for a memory device selectable using the design library.

Multiple memory devices can be combined to increase the width or depth of the data memory units. Multiple memory devices can also be combined to form data memory units with an increased number of read ports.

In an exemplary embodiment, the memory comprises a control unit configured to select among the first data memory unit and the second data memory unit in response to a read command having an associated read address which falls within the address range.

The control unit, such as control unit 108, includes multiple control memory units. One of the multiple control memory units has first and second write ports. In the example of FIG. 1, control memory unit 110 has a first write port 112 and a second write port 114. The one of the control memory units is configured such that a first value is written through the first write port when a predetermined write port associated with the first data memory unit is used to write. In the example of FIG. 1, when write port '0' of the memory 100 is used to write, the constant '0' is written through write port 112 of the control memory unit.

The control memory unit is also configured such that a second value is written through the second write port when another predetermined write port associated with the second data memory unit is used to write. In the example of FIG. 1, when the write port '2' which is associated with the data memory unit '1' is used to write, the constant value '1' is written through write port 114 of the control memory unit 110.

Each of the control memory units 110, 116, 118 and 120 stores, for each address in the address range, an indication of whether a predetermined write port of one data memory unit was used to write the address more recently than a predetermined write port of another data memory unit. In the example of FIG. 1, a per-address indication of which of the write ports was used to write more recently is maintained for each pair of write ports on different data memory units. Pairs of write ports associated with the same data memory unit need not maintain such a "most-recently-written" indication. In the example of FIG. 1, to determine which data memory unit was written most recently, only four "most-recently-written" indications are maintained.

In an exemplary embodiment, the control unit is configured as a write-only control unit in that the first and second values written through the write ports of a control memory unit are determined independently of data read from a control memory unit (e.g., are not modified, or calculated from data read from any control memory unit). In an exemplary embodiment, the first and second values are constants. In the example of FIG. 1, the constant value '0' is written through the write port 112 whenever the write port '0' of the memory 100 is used to write, and a constant value '1' is written through the write port 114 whenever a write port '2' of the memory 100 is used to write.

The control unit can include a select unit, such as select unit 122 of FIG. 1. The select unit is operably connected to the multiple control memory units to receive from the multiple control memory units stored values for a read address, and to produce from the stored values an indication of which data memory unit has the most recent data for the read addresses.

In the example of FIG. 1, a value '1' stored in an address location in the control memory unit 110 indicates that write port '2' of the memory 100 was used to write the same-addressed location of memory 100 more recently than write port '0' of the memory 100. A value '1' stored in an address in the control memory unit 116 indicates that write port '2' was used to write the same-addressed location of memory 100 more recently than write port '1' of memory 100. A value '1' stored in an address of the control memory unit 118 indicates that the write port '3' of the memory 100 was used to write the same-addressed location of memory 100 more recently than write port '0' of the memory 100. A value '1' stored in an address of the control memory unit 120 indicates that a write port '3' of the memory 100 was used to write the same-addressed location of memory 100 more recently than write port '1' of the memory 100.

In the example of FIG. 1, select unit 122 operates to output a value '1' when, for the address specified by the input read address of memory 100, write port '2' of memory 100 was used to write the same-addressed location of memory 100 more recently than both of the write ports associated with the data memory unit '0', or write port '3' of memory 100 was used to write the same-addressed location of memory 100 more recently than both of the write ports of the data memory unit '0'. The logic shown for the select unit 122 is only exemplary of the type of logic that can be used for a select unit.

In an exemplary embodiment of the present invention, the memory includes a multiplexer, such as the multiplexer 124 of FIG. 1, coupled with the first data memory unit and the second data memory unit. The multiplexer can be configured to receive a select memory signal from the control unit and to produce read data for the memory. In the example of FIG. 1, the select memory signal on line 126 from the select unit 122 of the control unit 108 indicates to the multiplexer 124 whether to select read data from the data memory unit 102 or the data memory unit 104.

If multiple read ports are available, the multiplexer along with a select unit in the control unit can be duplicated. One select unit and multiplexer can be provided for each read port of the memory, although any number of select units and multiplexers can, of course, be used.

In an exemplary embodiment, the control unit, such as the control unit 108 of FIG. 1, can be operably connected to the N write ports to receive write addresses and enables provided to the memory. One of the multiple control memory units, such as the control memory unit 110 of FIG. 1, can be configured to store for each address in the address range an indication of whether the predetermined write port or the another predetermined write port was used to write the address most recently. In the example of FIG. 1, the control memory unit 110 stores whether write port '2' or write port '0' of memory 100 was used to write the address more recently.

Figure 2:
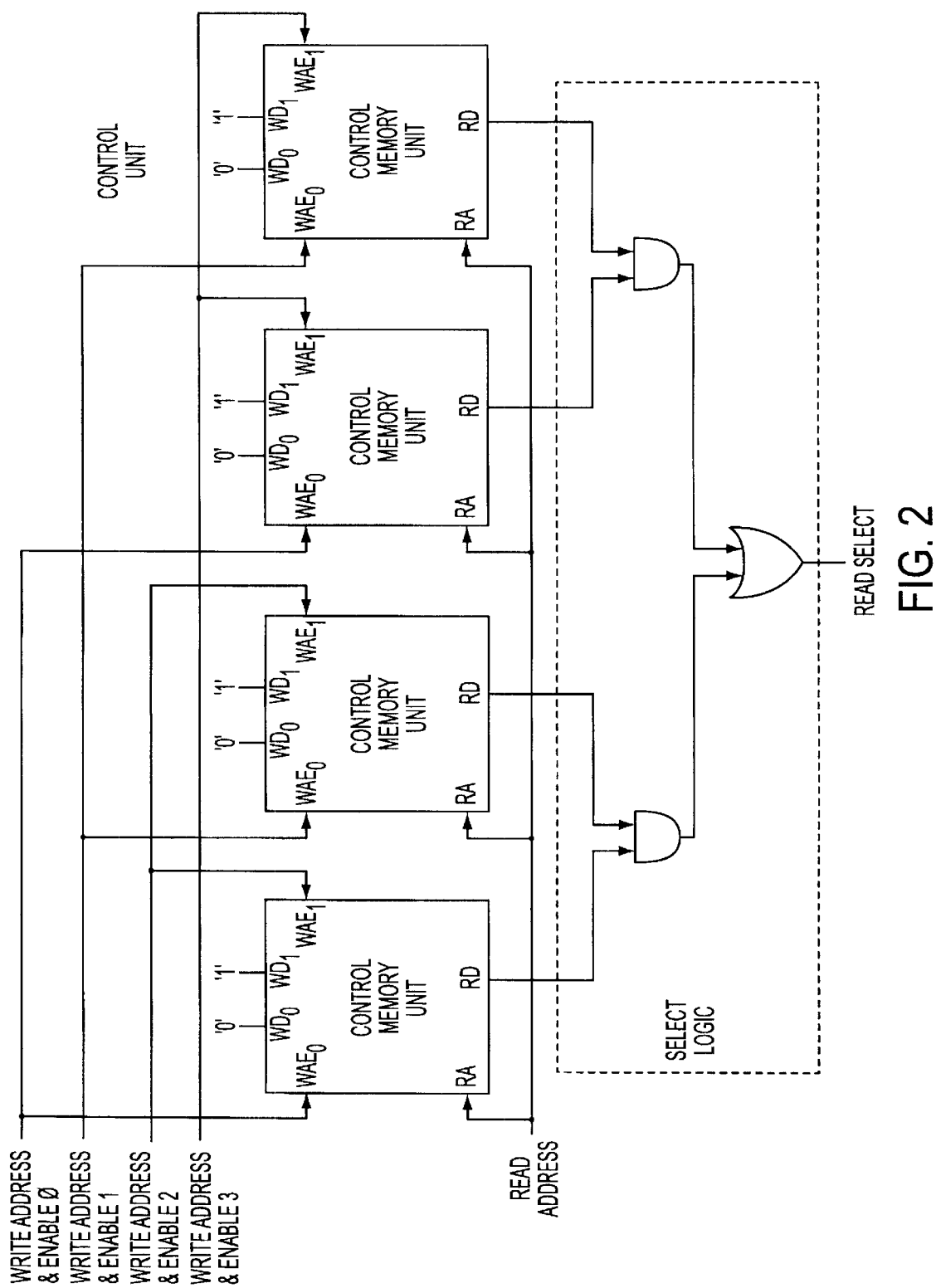
FIG. 2 is a diagram that illustrates a control unit of an exemplary embodiment of the present invention.

FIG. 2 is a diagram that illustrates one example of a control unit of the system of the present invention.

In an exemplary embodiment of the present invention, one or more of the multiple control memory units can be configured to store for each address in the address range an indication of whether any of the write ports in a predetermined group of write ports associated with one data memory unit were used to write the address more recently than all of the write ports in another predetermined group of write ports associated with another data memory unit.

Figure 3:
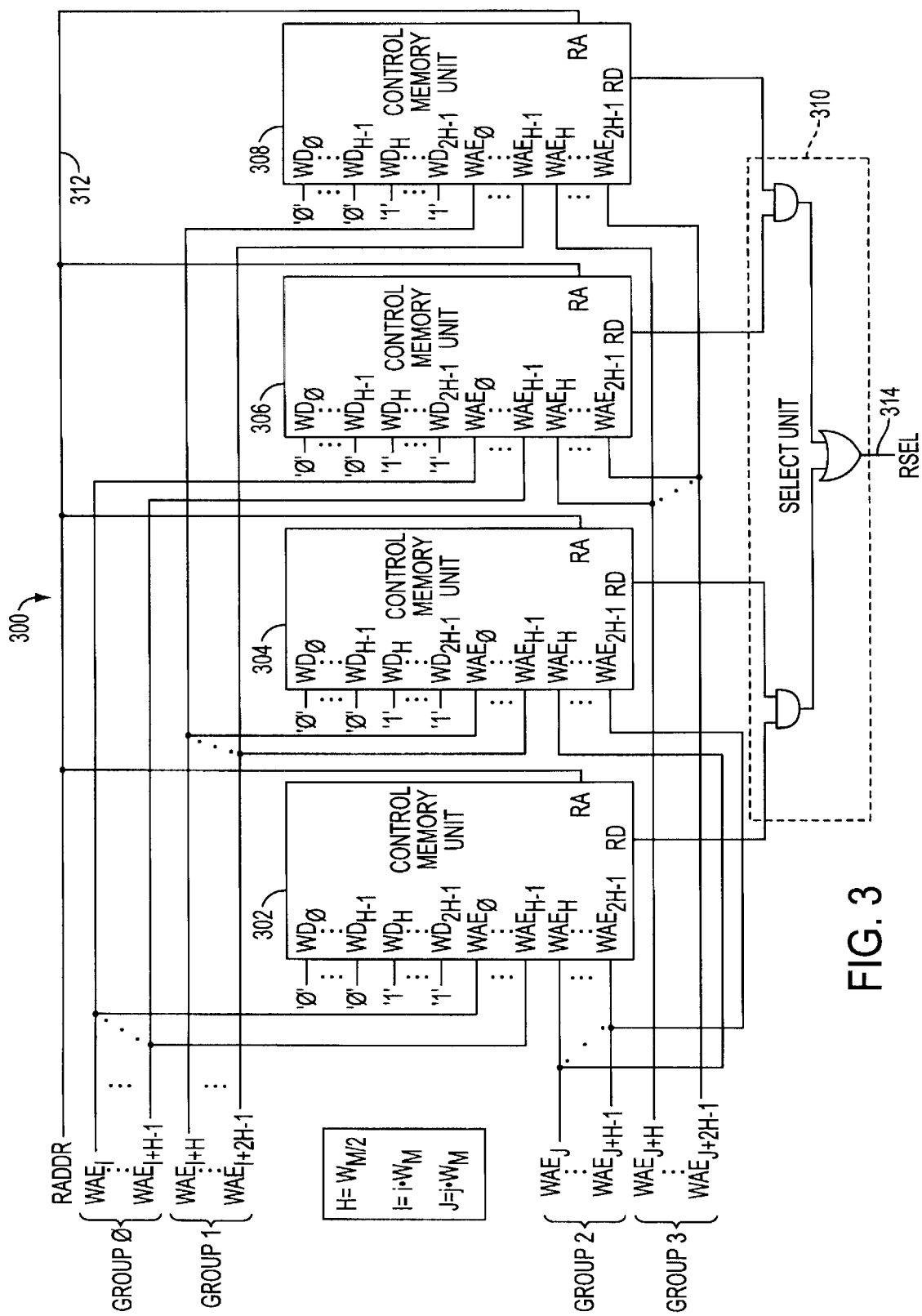
FIG. 3 is a diagram that illustrates a control unit of an exemplary embodiment of the present invention.

In the example of FIG. 3, group '0' and group '1' of write ports is associated with a first data memory unit. Group '2' and group '3' of write ports are associated with a second data memory unit. Each of the control memory units has more than two write ports. This means that each of the control memory units is able to store for each address in the address range an indication of whether any of the write ports in a specific group were used to write the address more recently than all of the write ports in a group associated with another data memory unit.

In the example of FIG. 3, the control memory unit 302 stores for each address in the address range an indication of whether any of the write ports in group '2' were used to write the address more recently than all of the write ports in group '0'. The control memory unit 304 stores for each address in the address range an indication of whether any of the write ports in group '2' were used to write the address more recently than all of the write ports in group '1'. The control memory unit 306 stores for each address in the address range an indication of whether any of the write ports in group '3' were used to write the address more recently than all of the write ports in group '0'. The control memory unit 308 stores for each address in the address range an indication of whether any of the write ports in group '3' were used to write the address more recently than all of the write ports in group '1'. The read data outputs of the control memory units 302, 304, 306 and 308 are sent to the select unit 310 which produces a select signal 314 to indicate the data memory unit that has been written to most recently for a given address input on the read address signal 312.

Figure 4:
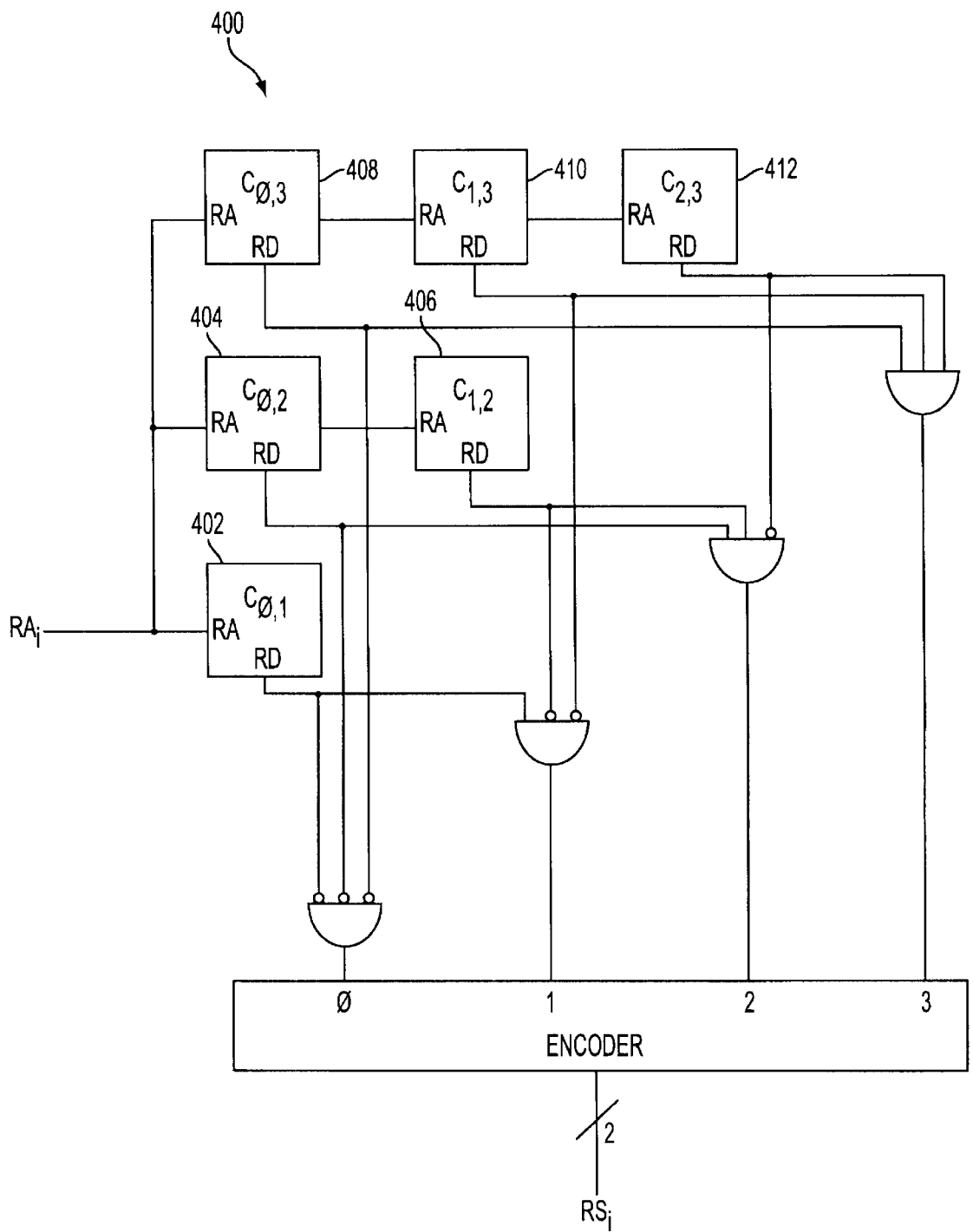
FIG. 4 is a diagram that illustrates a control unit of one embodiment of the present invention constructed of multiple control subunits, with the read address input to read select output signal paths shown.
Figure 6:
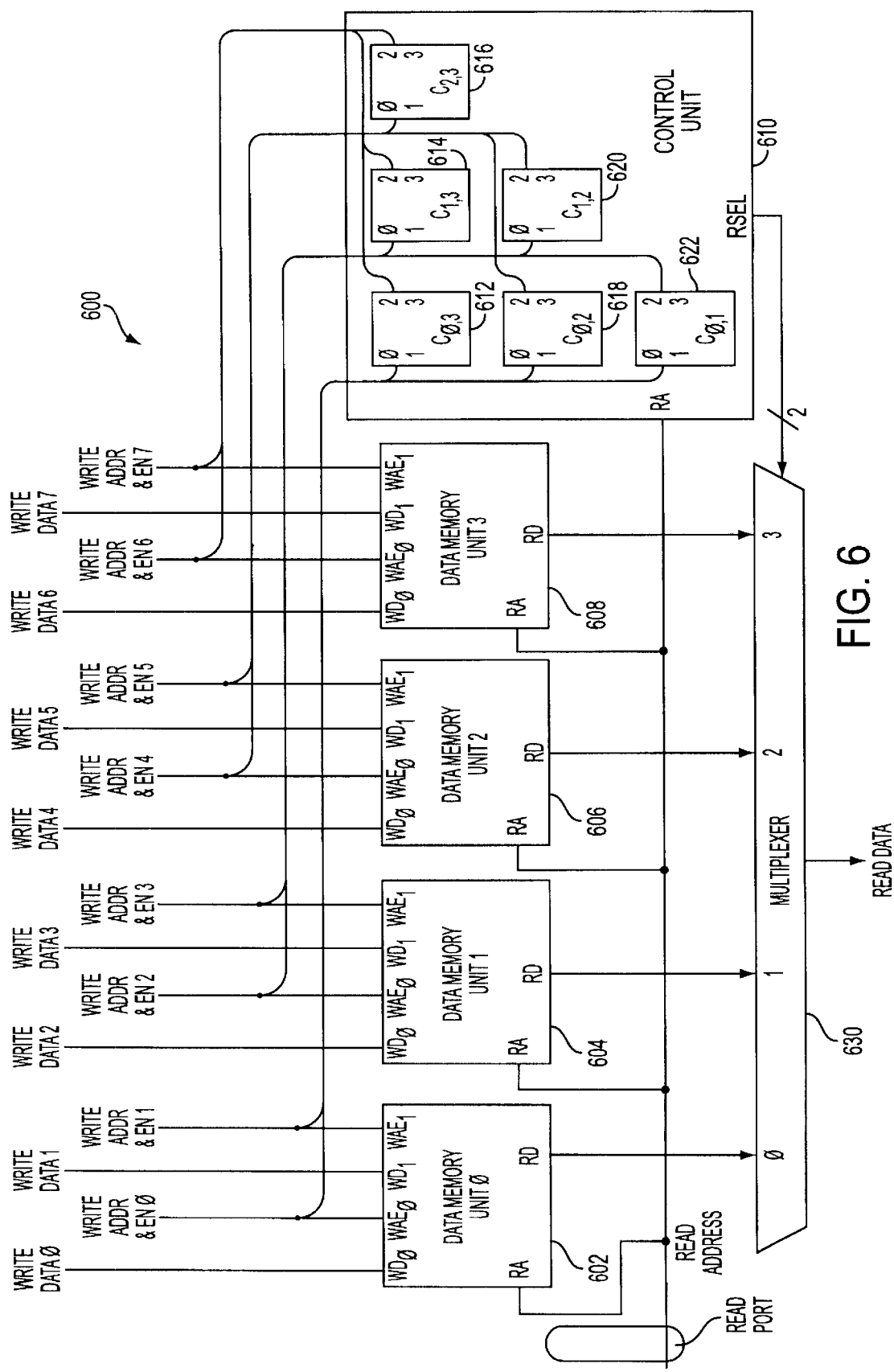
FIG. 6 is a diagram of an exemplary embodiment of the present invention that illustrates a memory constructed of four data memory units and a control unit.

In an exemplary embodiment, the control unit includes control subunits. In the example of FIG. 4, the control unit 400 selects between four data memory units, data memory units '0'; '1', '2' and '3' (not shown). An example of a memory with four data memory units is shown in FIG. 6. The control subunits 402, 404, 406, 408, 410 and 412 of FIG. 4 are configured to indicate which data memory unit, from a pair of data memory units, was most recently written to for an address. In the example of FIG. 4, the control subunit 402 determines whether the data memory unit '0' or data memory unit '1' has been written to more recently for an address. The control subunits can use a control unit design such as control unit designs of FIG. 2 or 3.

In the example of FIG. 4, if a write port associated with the data memory unit '3' has been used to write an address most recently, then the outputs of the control subunits 408, 410 and 412 will all be a '1', indicating that the data memory unit '3' had been written to more recently than the data memory units '0', '1' and '2'. If a write port associated with the data memory unit '0' has been used to write an address most recently, then the outputs of the control subunits 402, 404 and 408 will all be a '0', indicating that the data memory unit '0' had been written to more recently than the data memory units '1', '2' and '3'. The outputs of each of the control subunits can be combined using logic to indicate which one of the data memory units has been written to most recently for a given address. FIG. 4 shows read inputs and outputs of the control subunits. For simplicity, the write inputs to the control subunits have not been shown. The logic shown in FIG. 4 can be considered as part of the select unit with a portion of the select unit also being within the control subunit. The example of FIG. 4 can be shown as a flattened version with the control memory units contained within each of the control subunit blocks all shown together.

An exemplary embodiment of the present invention relates to having a method for operating a memory comprising providing a memory having N write ports where N is greater than 2. The memory is constructed of multiple data memory units, each data memory unit having less than N write ports and a range of addressable storage locations. The method also includes supplying information to an addressable location of the memory which falls within the range of addressable locations, the memory also including updating a control memory unit by writing a first value through the write port of the control memory unit when a predetermined write port associated with a first data memory unit is used to write, and by writing a second value through a second write port of a control memory unit when another predetermined write port associated with a second data memory unit is used to write. In an exemplary embodiment, the first and second values written through the write ports of a control memory unit are determined independently of data read from a control memory unit (e.g., are not modified or calculated from data read from any control memory unit). The method can include sending a read command in the form of an address to the memory, retrieving data values from each of the multiple data memory units, and selecting one of the data values to provide a current value.

An exemplary embodiment of the present invention comprises a control unit for memory, such as control unit 108 of FIG. 1, the control unit comprising multiple control memory units, such as the control memory units 110, 116, 118 and 120 of FIG. 1. One of the control memory units, such as the control memory unit 110 of FIG. 1, has first and second write ports and is configured such that a first value is written through the first write port when a predetermined write port associated with the first data memory unit is used to write, and such that a second value is written through the second write port when another predetermined write port associated with the second data memory unit is used to write. The control unit includes at least one select unit, such as select unit 122 of FIG. 1, the select unit receiving read data from the control memory units at a read address provided to the memory. The at least one select unit produces an indication of a data memory unit.

In an exemplary embodiment, the first and second values written through the write ports of a control memory unit are not calculated from data read from any control memory unit. The first and second values can be constants. One of the control memory units can be configured to store for each address in the address range an indication of whether the predetermined write port or the another predetermined write port was used to write the address most recently.

One or more of the multiple control memory units can be configured to store for each address in the address range an indication of whether a predetermined group of write ports associated with a first data memory unit or another predetermined group of write ports associated with a second data memory unit was used to write the address most recently.

In an exemplary embodiment, the control unit includes control subunits configured to indicate which data memory unit, from a pair of data memory units, was most recently written to for an address.

Figure 5:
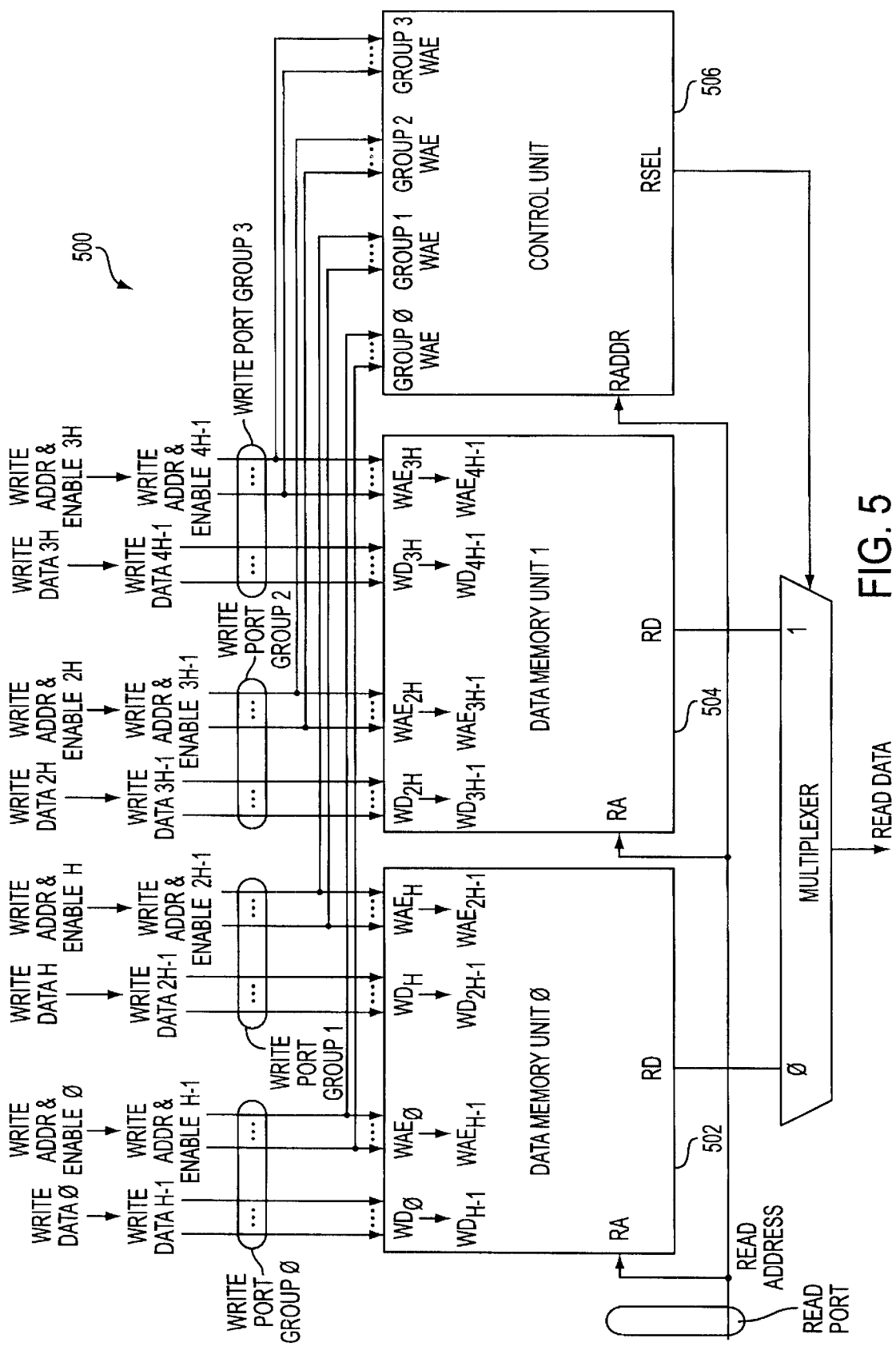
FIG. 5 is a diagram of an exemplary embodiment of the present invention that illustrates a memory constructed of two data memory units and a control unit.

FIG. 5 is a diagram of an exemplary embodiment of the present invention in which the memory 500 includes two data memory units 502 and 504 and a control unit 506. The memory 500 has 4 H write ports, where H is a generalized parameter of FIG. 5. However, the component memories of memory 500, namely data memory units 502 and 504, require only one half (namely 2 H) the number of write ports provided by memory 500. The write ports of each data memory unit are divided into two groups, each group having H write ports. Thus, the control unit 506 receives the write ports of memory 500 partitioned into four groups of H write ports each. An example embodiment of the control unit 506 is shown in the H-parameterized diagram of FIG. 3, with I=0 and J=2H.

FIG. 6 is a diagram of an exemplary embodiment of the present invention which illustrates a memory 600 constructed of four data memory units: data memory unit 602, data memory unit 604, data memory unit 606 and data memory unit 608. The memory 600 also includes a control unit 610 with six control subunits 612, 614, 616, 618, 620, and 622. The control subunits 612, 614, 616, 618, 620 and 622 determine which data memory unit of the memory units was written to more recently. An example embodiment of a control subunit of control unit 610 is shown in FIG. 2. In general, for a memory having X data memory units and a control unit, the control unit can have X*(X−1)/2 control subunits. The select output is provided to the multiplexer 630. The select output of control unit 610 can be generated based on a read address input by read select circuitry, an example of which is shown in FIG. 4.

Figure 7:
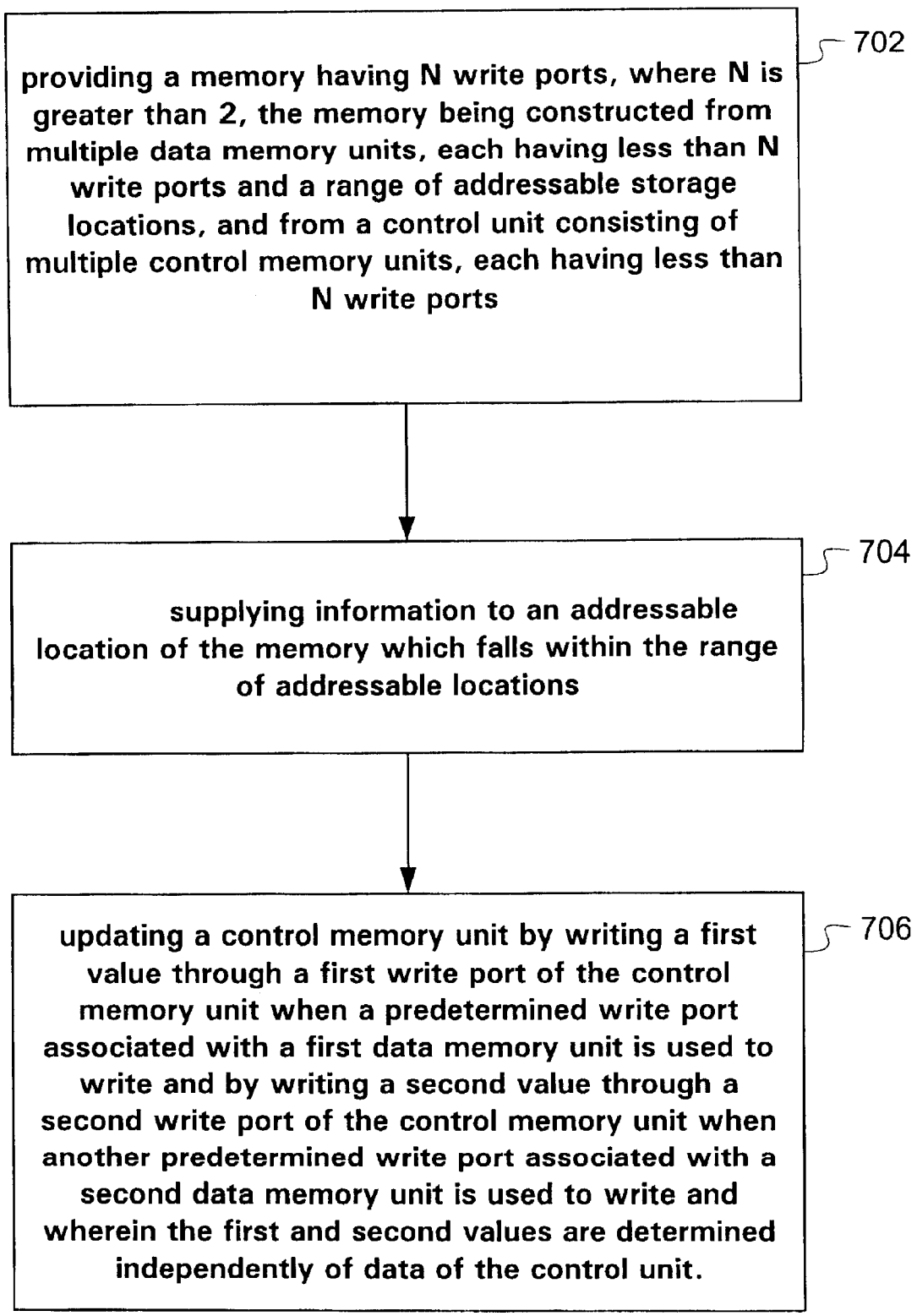
FIG. 7 is a flow chart that illustrates a method of an exemplary embodiment of the present invention.

FIG. 7 is a flow chart that illustrates a method according to an exemplary embodiment of the present invention. In step 702, a memory is provided having N write ports, where N is greater than 2. The memory includes multiple data memory units. Each data memory unit has less than N write ports and a range of addressable storage locations. The memory includes a control unit having (e.g., consisting of) multiple control memory units. Each control memory unit has less than N write ports.

In step 704, information is supplied to an addressable location of the memory that falls within the range of addressable locations. In step 706, a control memory unit is updated by writing a first value through a first write port of the control memory unit when a predetermined write port associated with a first data memory unit is used to write and by writing a second value through a second write port of the control memory unit when another predetermined write port associated with a second data memory unit is used to write. The first and second values are determined independently of any data read from a control memory unit.

A read command and an associated address can be sent to the memory. Data values can be retrieved from each of the multiple data memory units. One of the data values can be selected to provide a current value.

Figure 8:
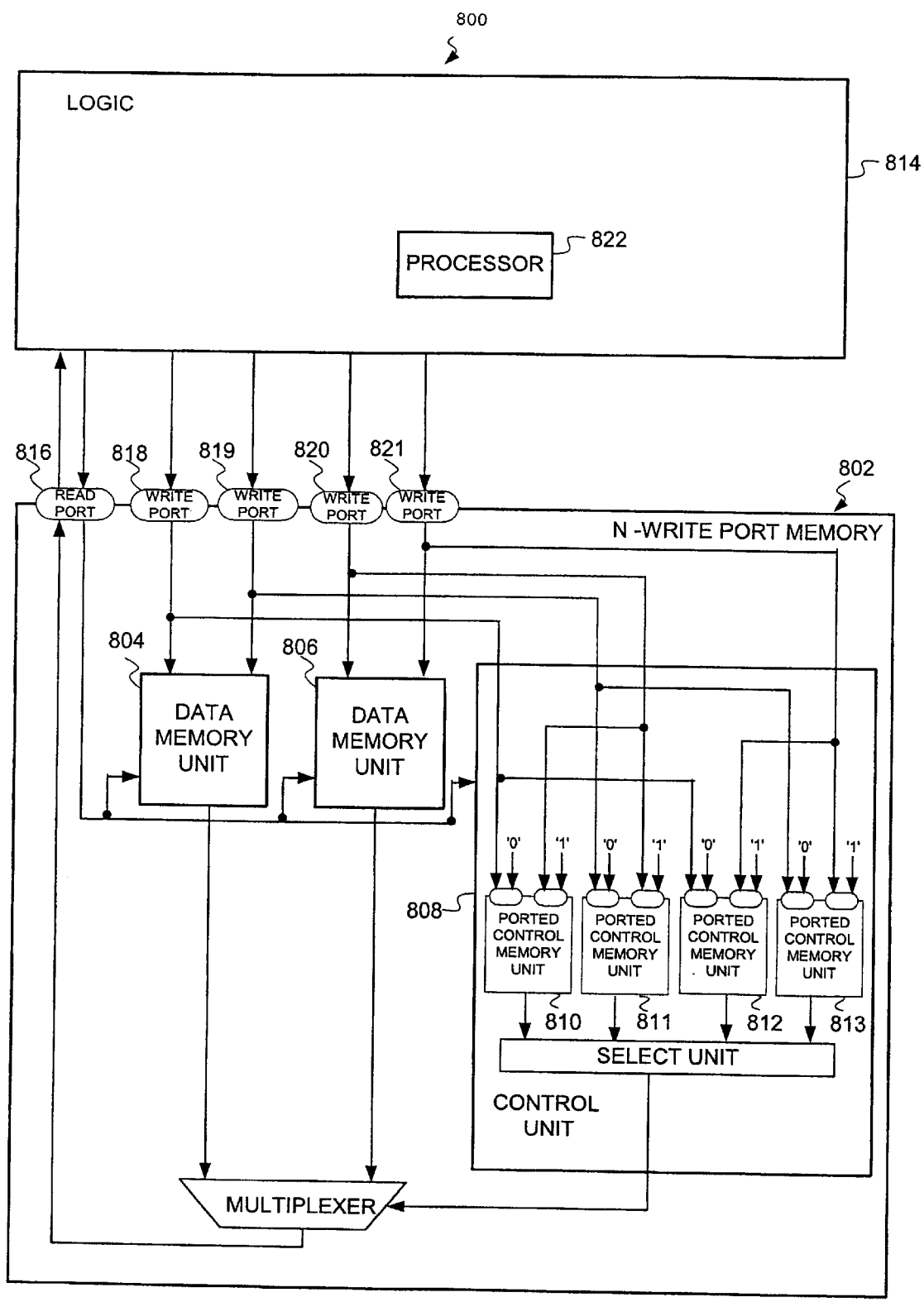
FIG. 8 is a diagram of an exemplary embodiment of a system including a memory constructed of multiple data memory units and a control unit.

FIG. 8 is a diagram of an exemplary embodiment of a system 800 including a memory 802 constructed of multiple data memory units 804 and 806 and a control unit 808. The memory has N write ports, wherein N is greater than 2. The memory comprises a first data memory unit 804 with a plurality of storage locations addressable by a range of addresses. The first data memory unit 804 has less than N write ports. The memory 802 has a second data memory unit 806 having a plurality of storage locations addressable by the range of addresses. The second data memory unit 806 has less than N write ports. The control unit 808 is configured to select among the first data memory unit and the second data memory unit in response to a read command having an associated read address which falls within the address range. The control unit 808 includes multiple control memory units 810, 811, 812, and 813 each having less than N write ports. One of the multiple control memory units has first and second write ports and is configured such that a first value is written through the first write port when a predetermined write port associated with the first data memory unit is used to write, and such that a second value is written through the second write port when another predetermined write port associated with the second data memory unit is used to write. The first and second values are determined independently of data read from a control memory unit.

The system 800 includes logic 814 configured to access the memory 802. In the example of FIG. 8, the logic 814 accesses the memory using read port 816 and write ports 818, 819, 820 and 821.

The logic 814 can include a processor 822. The processor 822 can be part or all of the logic 814.

The logic 814 and the memory 802 can be on a single chip. This chip can be a reconfigurable logic chip or another type of chip such as an ASIC.

The logic 814 and the memory 802 can be on different chips. In one embodiment, the logic 814 comprises a processor chip and the memory 802 is part of a separate chip, such as a reconfigurable logic chip or an ASIC.

While there has been described what are believed to be the preferred embodiments of the present invention, those skilled in the art will recognize that other and further changes and modifications may be made thereto without departing from the spirit of the invention which is defined by the appended claims, and it is intended to claim all such changes and modifications as fall within the true scope of the invention. The presently disclosed embodiments are therefore considered in all respects to be illustrative and not restricted. The scope of the invention described by the foregoing includes all changes that come within the meaning, range and equivalence thereof and is intended to be embraced therein.

What is claimed is:

1. A memory having N write ports, wherein N is greater than 2, comprising:
    a first data memory unit having a plurality of storage locations addressable by a range of addresses, and having less than N write ports;
    a second data memory unit having a plurality of storage locations addressable by the range of addresses, the second data memory unit having less than N write ports; and
    a control unit configured to select among the first data memory unit and the second data memory unit in response to a read command having an associated read address which falls within the address range, the control unit including multiple control memory units each having less than N write ports, wherein one of the multiple control memory units has first and second write ports and is configured such that a first value is written through the first write port when a predetermined write port associated with the first data memory unit is used to write, and such that a second value is written through the second write port when another predetermined write port associated with the second data memory unit is used to write, and wherein the first and second values are determined independently of data read from a control memory unit.

2. The memory of claim 1, wherein the control unit comprises a select unit operably connected to the multiple control memory units to receive from the multiple control memory units stored values for a read address and to produce from the stored values an indication of which data memory unit has the most recent data for the read address.

3. The memory of claim 1, comprising a multiplexer coupled with the first data memory unit and the second data memory unit, the multiplexer configured to receive a select memory signal from the control unit and to produce read data for the memory.

4. The memory of claim 1, wherein the first and second values are constants.

5. The memory of claim 1, wherein the control unit is operably connected to the N write ports to receive write addresses and enables provided to the memory.

6. The memory of claim 1, wherein the one of the multiple control memory unit is configured to store, for each address of the address range, an indication of whether the predetermined write port or the another predetermined write port was used to write the address more recently.

7. The memory of claim 1, wherein the one of the multiple control memory unit is configured to store, for each address of the address range, an indication of whether a predetermined group of write ports associated with the first data memory unit or another predetermined group of write ports associated with the second data memory unit was used to write most recently.

8. The memory of claim 1, wherein the control unit includes control subunits configured to indicate which data memory unit, from a pair of data memory units, was most recently written to for an address.

9. A method for operating a memory comprising:
    providing a memory having N write ports, where N is greater than 2, the memory being constructed from multiple data memory units, each having less than N write ports and a range of addressable storage locations, and from a control unit consisting of multiple control memory units, each having less than N write ports;
    supplying information to an addressable location of the memory which falls within the range of addressable locations; and
    updating a control memory unit by writing a first value through a first write port of the control memory unit when a predetermined write port associated with a first data memory unit is used to write and by writing a second value through a second write port of the control memory unit when another predetermined write port associated with a second data memory unit is used to write and wherein the first and second values are determined independently of any data read from a control memory unit.

10. The method of claim 9, comprising:
    sending a read command and an associated address to the memory;
    retrieving data values from each of the multiple data memory units; and
    selecting one of the data values to provide a current value.

11. A control unit for a memory having N write ports where N is greater than two comprising:
    multiple control memory units, each having less than N write ports, one of the multiple control memory units having first and second write ports and being configured such that a first value is written through the first write port when a predetermined write port associated with a first data memory unit is used to write and such that a second value is written through the second write port when another predetermined write port associated with a second data memory unit is used to write and wherein the first and second values are not calculated using data from a control memory unit; and
    at least one select unit receiving read data from the control memory units at a read address provided to the memory, the at least one select unit producing an indication of a data memory unit.

12. The control unit of claim 11, wherein the first and second values are constants.

13. The control unit of claim 11, wherein the one of the multiple control memory units is configured to store for each address of the address range an indication of whether the predetermined write port or the another predetermined write port was used to write the address most recently.

14. The control unit of claim 11, wherein the one of the multiple control memory units is configured to store for each address of the address range an indication of whether a predetermined group of write ports associated with the first data memory unit or another predetermined group of write ports associated with the second data memory unit was used to write most recently.

15. The control unit of claim 11, wherein the control unit includes control subunits configured to indicate which data memory unit, from a pair of data memory units, was most recently written to for an address.

16. A system comprising:
    a memory having N write ports, wherein N is greater than 2, the memory including a first data memory unit having a plurality of storage locations addressable by a range of addresses, and having less than N write ports, the memory including a second data memory unit having a plurality of storage locations addressable by the range of addresses, the second data memory unit having less than N write ports, the memory including a control unit configured to select among the first data memory unit and the second data memory unit in response to a read command having an associated read address which falls within the address range, the control unit including multiple control memory units each having less than N write ports, wherein one of the multiple control memory units has first and second write ports and is configured such that a first value is written through the first write port when a predetermined write port associated with the first data memory unit is used to write, and such that a second value is written through the second write port when another predetermined write port associated with the second data memory unit is used to write, and wherein the first and second values are determined independently of data read from a control memory unit; and logic configured to access the memory.

17. The system of claim 16, wherein the logic includes a processor.

18. The system of claim 16, wherein the logic and the memory are on a single chip.

19. The system of claim 18, wherein the chip is a reconfigurable logic chip.

20. The system of claim 16, wherein the logic and the memory are on different chips.

* * * * *